(12) United States Patent
Musil et al.

(10) Patent No.: US 6,753,538 B2
(45) Date of Patent: Jun. 22, 2004

(54) ELECTRON BEAM PROCESSING

(75) Inventors: Christian R. Musil, Cambridge, MA (US); J. David Casey, Jr., WestRoxbury, MA (US); Thomas J. Gannon, Ipswich, MA (US); Clive Chandler, Portland, OR (US); Xiadong Da, Portland, OR (US)

(73) Assignee: FEI Company, Hillsboro, OR (US)

( * ) Notice: Subject to any disclaimer, the term of this patent is extended or adjusted under 35 U.S.C. 154(b) by 3 days.

(21) Appl. No.: 10/206,843

(22) Filed: Jul. 27, 2002

(65) Prior Publication Data

US 2003/0047691 A1 Mar. 13, 2003

Related U.S. Application Data

(60) Provisional application No. 60/308,490, filed on Jul. 27, 2001.

(51) Int. Cl.[7] .............................................. C23C 14/32
(52) U.S. Cl. ............. 250/492; 204/192.11; 204/192.32; 360/131
(58) Field of Search .............................. 250/492.2, 492; 216/66; 204/192.11, 192.32; 430/5; 360/131

(56) References Cited

U.S. PATENT DOCUMENTS

| | | | |
|---|---|---|---|
| 4,639,301 A | 1/1987 | Doherty et al. | 204/192.31 |
| 5,104,684 A | 4/1992 | Tao et al. | 427/38 |
| 5,149,974 A | 9/1992 | Kirch et al. | 250/492.2 |
| 5,435,850 A | 7/1995 | Rasmussen | 118/726 |
| 5,851,413 A | 12/1998 | Casella et al. | 216/92 |
| 6,042,738 A * | 3/2000 | Casey et al. | 216/66 |
| 6,159,641 A | 12/2000 | Baum et al. | 430/5 |
| 6,368,753 B1 * | 4/2002 | Harriott et al. | 430/5 |
| 6,440,615 B1 | 8/2002 | Shimizu | 430/5 |

OTHER PUBLICATIONS

Ferranti et al., "Method and Apparatus for Repairing Lithographic Masks Using a Charged Particle Beam System", (Pub. No. ☐☐US2001/0027917 A1, publication date: Oct. 11, 2001.*

"Electron Beam Induced Selective Etching and Deposition Technology," *Journal of Vacuum Science and Technology B*, vol. 7, No. 5 (1989).

"F–Beam Probe Station with Integrated Tool for Electron Beam Induced Etching", *Microelectronic Engineering 31*, pp. 141–147 (1996).

"Measurements of the Energy Dependence of Electron Beam Assisted Etching of, and Deposition on, Silica", *IOP Publishing Ltd*, pp. 267–268 (1990).

"Electron–Beam Induced Etching of Resist with Water Vapor as the Etching Medium," *Journal of Vacuum Science and Technology B*, vol. 14, No. 6 (1996).

"Electron–Beam Induced Etching (EBE) Integrated Into an E–Beam Probe Station," *20th International Symposium for Testing and Failure Analysis*, Nov. 13–18, 1994, pp. 19–22.

"Direct Writing onto Si by Electron Beam Stimulated Etching," *Appl. Phys. Lett*, vol. 51, No. 19 (1987).

"Electron Beam Induced Selective Etching and Deposition Technology," *Superlattices and Microstructures*, vol. 7, No. 4 (1990).

* cited by examiner

*Primary Examiner*—John R. Lee
*Assistant Examiner*—Zia R. Hashmi
(74) *Attorney, Agent, or Firm*—Michael O Scheinberg (57) ABSTRACT

A method and apparatus for electron beam processing using an electron beam activated gas to etch or deposit material. The invention is particularly suitable for repairing defects in lithography masks. By using an electron beam in place of an ion beam, the many problems associated with ion beam mask repair, such as staining and riverbedding, are eliminated. Endpoint detection is not critical because the electron beam and gas will not etch the substrate. In one embodiment, xenon difluoride gas is activated by the electron beam to etch a tungsten, tantalum nitride, or molybdenum silicide film on a transmission or reflection mask. To prevent spontaneous etching by the etchant gas in processed sites at which the passivation layer was removed, processed sites can be re-passivated before processing additional sites.

49 Claims, 4 Drawing Sheets

ELECTRON BEAM PROCESSING

This application claims priority from U.S. Provisional Pat. App. No. 60/308,490, filed Jul. 27, 2001, which is hereby incorporated by reference.

TECHNICAL FIELD OF THE INVENTION

The present invention relates to the field of charged particle beam processing and, in particular, to a method and apparatus using an electron beam to create or alter microscopic structures, such as to repair photolithography masks.

BACKGROUND

Photolithography processes are widely used in the fabrication of integrated circuits. In a typical photolithography process, a thin layer of a photoactive material called "photoresist" is deposited onto the surface of a semiconductor substrate, such as a silicon wafer. The photoresist can be composed of any of a number of different materials whose chemical structure changes when exposed to a certain type of radiation. This change in chemical structure can cause the photoresist to become more soluble, in the case of a positive photoresist, or less soluble, in the case of a negative photoresist, in a chemical solution referred to as a developer.

A photolithography mask in the shape of a desired circuit pattern is used as a template to transfer the circuit pattern to the surface of the semiconductor substrate. A typical transmission mask has a pattern of clear and opaque areas, repeated over its surface, that is used to fabricate a layer of a circuit. The mask, when positioned between an appropriate radiation source and the photoresist-coated semiconductor substrate, casts a shadow onto the photoresist and thus controls which areas of the photoresist are exposed to the radiation.

After exposure, the photoresist is removed from either the exposed or the unexposed areas by washing with an appropriate developer. This leaves a patterned layer of photoresist on the wafer that protects parts of the wafer during a subsequent process step, such as etching, deposition, or diffusion. After the subsequent process step in completed, the remaining photoresist is removed. This photolithography process ultimately allows the actual circuitry to be integrated into a semiconductor chip.

Obviously, the mask is a key element in this process since it is the mask that determines the circuit pattern that is transferred to the semiconductor substrate. A mask comprises a patterned layer of an opaque absorber material, such as a metallic film of chromium or tungsten, on a substrate of a transparent material, such as quartz. Features on a mask can be as small as a few millionths of an inch. When the pattern is formed on the mask, typically by using computer controlled laser or electron beam systems to expose the desired mask pattern in a photoresist material, it is not unusual for the mask to have defects. There are essentially two defect types, opaque and clear. Clear defects are areas where absorber is missing from areas that should be opaque; opaque defects are areas having absorber material deposited in areas that should be clear. Since any defect in the mask will ultimately be transferred to any semiconductor chip manufactured using that mask, these defects must be repaired before the mask can be used.

Traditionally, focused ion beam systems (FIB) have been used to repair defects in photolithography masks. A finely focused beam of gallium ions from a liquid metal ion source is scanned across the mask surface to form an image of surface. The intensity at each point of the image is determined by the current of secondary electrons ejected by the ion beam at the corresponding point on the substrate. The defect is identified on the image, and the ion beam is then scanned over the defect area in order to remove the excess absorber material from a mask surface or to deposit missing absorber material.

When used to remove material, the heavy gallium ions in the focused ion beam physically eject atoms or molecules from mask surface by sputtering, that is, by a transfer of momentum from the incoming ions to the atoms at the surface. The momentum transfer mechanism is considered to function through a series of collisions with nuclei in the substrate lattice, the process being referred to as a "collision cascade."

When a FIB is used to deposit material to repair a clear defect, a gas is directed toward the defect area, and material is deposited by using an ion beam to decompose gas molecules absorbed on the substrate surface. A process for depositing a metal material using a FIB is described, for example, in U.S. Pat. No. 5,104,684 to Tao entitled "Ion Beam Induced Deposition of Metals."

There are several problems with the use of gallium ion FIB systems to repair masks, particularly when used to repair opaque defects. First, gallium ions become implanted into the substrate surrounding the defect area. This phenomenon, commonly referred to as "staining," causes the stained substrate to lose some of its transparency. This loss of transparency, in turn, introduces defects in the mask image that is transferred to the semiconductor substrate. The loss of transparency is particularly severe for the very short exposing light wavelengths used in modern photolithography processes, with the loss of transparency typically being between three and ten percent.

Second, the sputtering process of the focused ion beam is relatively unselective. While an opaque defect is being removed by the ion beam, substrate material at the edge of the defect is also attacked, and the result is a trench of damaged substrate material around the defect. This type of substrate damage is known as "riverbedding" because the etched edges resemble riverbeds when viewed with an electron microscope. Riverbedding results in an altered intensity and phase for the light traversing the quartz surrounding the defect.

Third, the sputtering of material by the ion beam leads to ejection of material in all directions, and some of this ejected material comes to rest on adjacent surfaces. This effect, known as redeposition, limits the precision of the microstructure fabrication.

Lastly, because the mask substrate is typically made of an insulating material, a positive electrical charge tends to accumulate on isolated defects when they are bombarded by the positive gallium ions. Each positively charged gallium ion not only brings a positive charge to the area, each massive ion also ejects multiple electrons from the surface. As this positive charge accumulates, it will reduce the emission of secondary electrons by which an image of the defect is attained. Ion beam systems used for mask repair typically include a charge neutralizer, such as an electron flood gun as described in U.S. Pat. No. 4,639,301 to Doherty, et al. for "Focused Ion Beam Processing." It can be difficult to adjust the flood gun to just neutralize the surface charge, especially as the surface composition under bombardment is changing as the absorber material is removed.

Sputtering by an FIB system can be further enhanced and some of the previously described problems can be minimized by using an etching gas that adsorbs onto the surface and forms volatile compounds with the surface atoms under impact of the ion beam. The surface atoms are then more readily removed and less likely to redeposit. The gas atoms react with the surface molecules when energy is provided by the incoming ions. The incoming ions do not significantly react directly with the adsorbed gas molecules. The ions typically react in a series of collisions with atoms in the substrate, the collisions providing energy back through the lattice to knock atoms from the surface and instigate chemical reactions with the adsorbed gas molecules. Some gases cause the ion beam to preferentially etch one material over another. Although the use of a gas can reduce the enumerated problems associated with gallium-based FIB systems, the problems still remain.

Some materials are known to be etched by an etchant chemical in the presence of an electron beam. For example, Matsui et al. in "Electron Beam Induced Selective Etching and Deposition Technology," *Journal of Vacuum Science and Technology B*, Vol. 7, No. 5 (1989) describes electron beam induced etching of silicon, gallium arsenide, and polymethylmethacrylate using xenon difluoride, chlorine, and $ClF_3$. Matsui et al. also describe the deposition of tungsten using tungsten hexafluoride in the presence of an electron beam. Winkler et al. in "E-Beam Probe Station With Integrated Tool For Electron Beam Induced Etching," *Microelectronic Engineering* 31, pp. 141–147 (1996) describes electron beam induced etching of insulation layers, such as $SiO_2$, $SiN_4$, and polyimide on integrated circuits.

Chemically induced etching using an electron beam occurs through a different mechanism than the mechanism of ion beam sputtering. An electron beam will not etch in the absence of a chemical, whereas an ion beam will always sputter material, even though sputtering may be enhanced or attenuated by a gas.

Electrons cannot sputter material because the momentum of an electron in a typical electron beam is not sufficient to remove molecules from a surface by momentum transfer. The amount of momentum that is transferred during a collision between an impinging particle and a substrate particle depends not only upon the momentum of the impinging particle, but also upon the relative masses of the two particles. Maximum momentum is transferred when the two particles have the same mass. When there is a mismatch between the mass of the impinging particle and that of the substrate particle, less of the momentum of the impinging particle is transferred to the substrate particle.

A gallium ion used in focused ion beam milling has a mass of over 130,000 times that of an electron. In a typical focused ion beam system, the gallium ions are accelerated through a voltage of 25–50 kV, whereas the electrons in a transmission electron microscope are typically accelerated through a voltage of 100 kV. The momentum transfer of a typical 30 kV gallium ion impinging on a copper substrate in a FIB system is therefore greater than 20,000 times that of a 100 kV electron in an electron microscope.

Because of the difference between electron beams and ion beams, electron beams are not typically used in mask repair.

SUMMARY OF THE INVENTION

An object of the invention, therefore, is to use an electron beam to create or alter microscopic structures, such as to repair photolithography masks.

In accordance with one aspect of the invention, an electron beam is directed toward the material to be processed along with a gas that etches the material in the presence of the electron beam. As the electron beam scans the area, material is removed or deposited by a chemical reaction induced by the electron beam. The invention is particularly useful in the repair of photolithography masks but is also useful for processing metals and other materials on any type of work piece.

In some embodiments, processing can remove a passivation layer from a processed site, and the site is optionally re-passivated before other sites are processed.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

The present invention provides methods for employing an electron beam system in the repair of a lithography mask or for etching metal on a work piece.

Electron beam-induced etching can repair certain opaque mask defects without the staining, riverbedding, and redeposition caused by gallium-based FIB systems. The electron beam is directed toward the defect area in the presence of a gas that etches the surface in the presence of the electron beam. As the electron beam scans the defect area, the defective opaque material is removed by a chemical reaction induced by the electron beam. The invention can be similarly be used to etch metallic or ceramic materials on any type of work piece.

An electron beam can also be used to deposit a material to repair clear defects on a lithography mask by inducing a chemical reaction in a gas that decomposes to leave an appropriate material on the surface. For example, an opaque material such as carbon or tungsten can be deposited to absorb radiation on a transmission mask, or a reflective material can be deposited on a reflective mask. Tungsten can be deposited using $WF_6$ gas. Electron beam-activated gases that deposit gold and a combination of silicon and oxygen can also be used in mask repair. The term "electron beam-activated gas" as used herein includes gases, such as $XeF_2$, that also react in the absence of an electron beam, but the reaction in the presence of an electron beam is more controllable.

Figure 1:
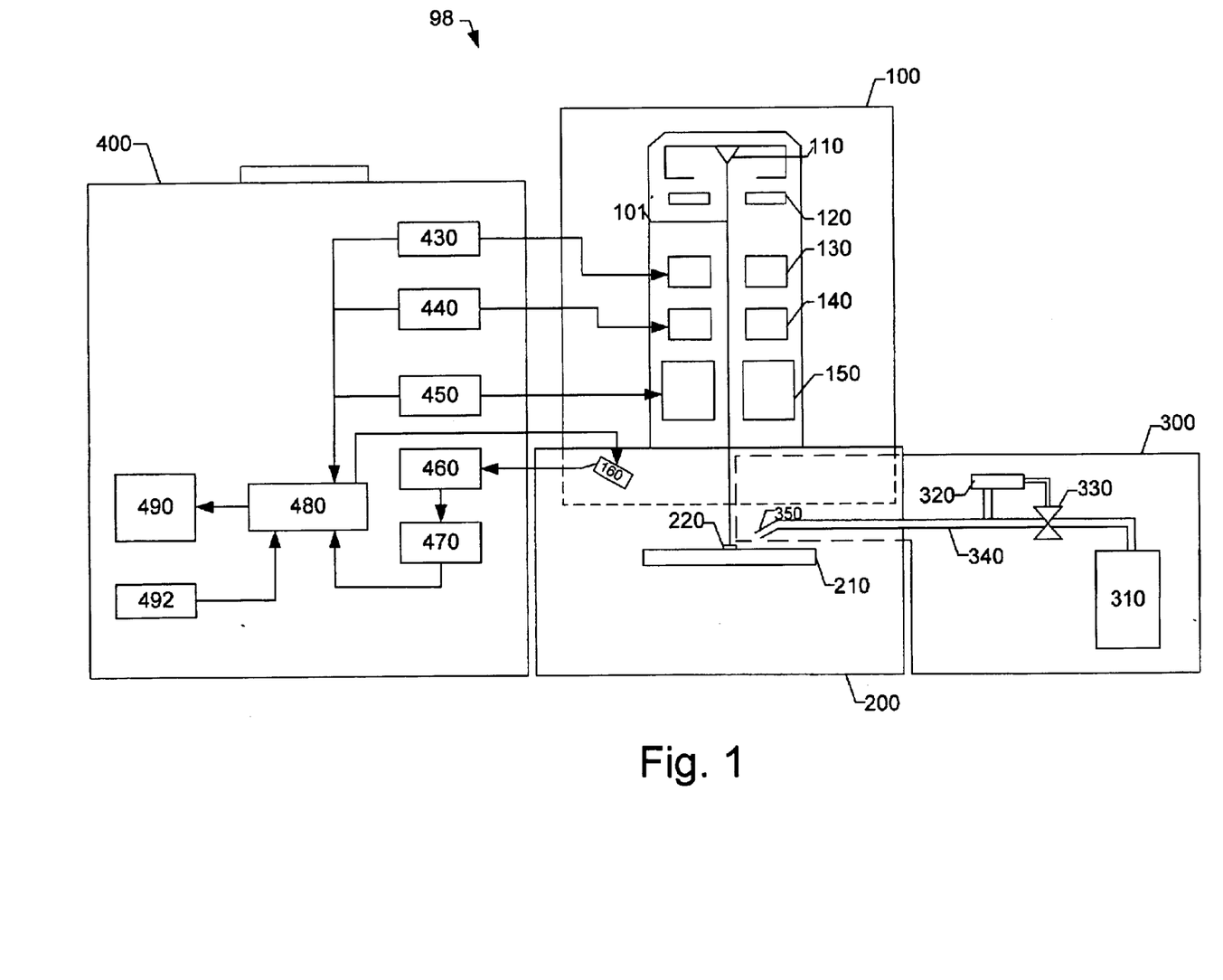
FIG. 1 shows schematically a typical electron beam system used in a preferred embodiment of the invention.

In accordance with one embodiment of the invention, molecules of an electron beam-activated gaseous compound are adsorbed onto the surface of a mask in an electron beam system. The gaseous compound causes one or more materials on the surface of the mask to be selectively etched in the presence of the electron beam. The selective etching allows the removal of some materials while minimally affecting other materials on the surface of the mask. For example, an opaque absorber material may be etched while the transparency of the substrate is substantially unaffected. Because the etching is purely chemical in nature and does not rely on physical sputtering, it is highly selective and causes none of the repair-induced damage that typically accompanies FIB etching. Unlike FIB mask repair processes, the inventive process does not introduce any foreign atoms into the substrate and so avoids staining. The term FIG. 1 depicts one embodiment of an electron beam system 98 for carrying out the present invention. The electron beam system depicted in FIG. 1 includes an electron beam column 100, a specimen vacuum chamber 200, a reactant material delivery system 300, and a user control station 400.

An electron beam 101 is emitted from a cathode 110 by applying voltage between cathode 110 and an anode 120. Electron beam 101 is focused to a fine spot by means of a condensing lens 130 controlled by a condensing lens control circuit 430 and an objective lens 150 controlled by an objective lens control circuit 450. Electron beam 101 is scanned two-dimensionally on the specimen by means of a deflection coil 140 controlled by a deflection control circuit 440. Operation of condensing lens control circuit 430, objective lens control circuit 450, and deflection coil control circuit 440 is controlled by the control unit 480.

Electron beam 101 is focused onto a work piece 220, such as a photolithography mask having a metallic film absorber material patterned on a substrate. Work piece 220 is located on a movable stage 210 within the specimen vacuum chamber 200. The specimen vacuum chamber 200 includes a secondary electron detector 160 for detecting secondary particles suitable for generating an image of the work piece. The operation of secondary electron detector 160 is controlled by the control unit 480. Secondary electron detector 160 is also connected to an amplifier 460. The amplified signals are converted into digital signals and subjected to signal processing by the signal processor unit 470. The resulting digital signal is used by control unit 480, such as a CPU, in coordination with signals from deflection control 440 and to display an image of work piece 220 on the monitor 490.

Control unit 480 coordinates deflection control 440 with the image displayed on monitor 490 so that, for example, an operator can use an input device 492 to indicate on monitor 490 an area over which to scan the beam. Control unit 480 can then cause deflection control unit 480 to apply appropriate voltages to deflection coil 140 to scan the beam in accordance with operator input. Control unit 480 can also automatically or semi-automatically interpret input from secondary electron detector 160 to differentiate between types of materials on the surface of work piece 220 and can then determine an area to be scanned and direct deflection control unit 480 to scan the determined area.

The depicted reactant material delivery system 300 includes a reservoir 310 connected to a delivery conduit 340 that has a distal portion formed as a nozzle for delivering reactant materials to the surface of work piece 220. The depicted reactant delivery system 300 includes a manometer 320 coupled to delivery conduit 340 for measuring the delivery pressure within delivery conduit 340 of any reactant materials being delivered to the surface of work piece 220. Manometer 320 further couples to the motorized valve element 330. Motorized valve element 330 is selectively controllable for increasing or reducing the flow of reactant materials of reservoir 310 through delivery conduit 340. The arrangement of manometer 320 and motorized valve element 330 depicted in FIG. 1 forms a feedback control system, wherein manometer 320 measures the delivery pressure within delivery conduit 340 and selectively controls motorized valve element 330 to increase or decrease the flow of reactant material to thereby maintain a selected delivery pressure.

A preferred type of gas delivery system is described in more detail in U.S. Pat. No. 5,149,974 to Kirch et al. for "Gas Delivery for Ion Beam Deposition and Etching." Other gas delivery systems, such as those described in U.S. Pat. No. 5,851,413 to Casella et al. for "Gas Delivery Systems For Particle Beam Processing" or in U.S. Pat. No. 5,435,850 to Rasmussen for a "Gas Injection System," can be used. Any type of gas delivery system can be used if it delivers an appropriate amount of the etchant gas to the work piece surface while maintaining an adequate vacuum for the electron beam. For example, the etchant supply may be located inside or outside the vacuum chamber.

Figure 2:
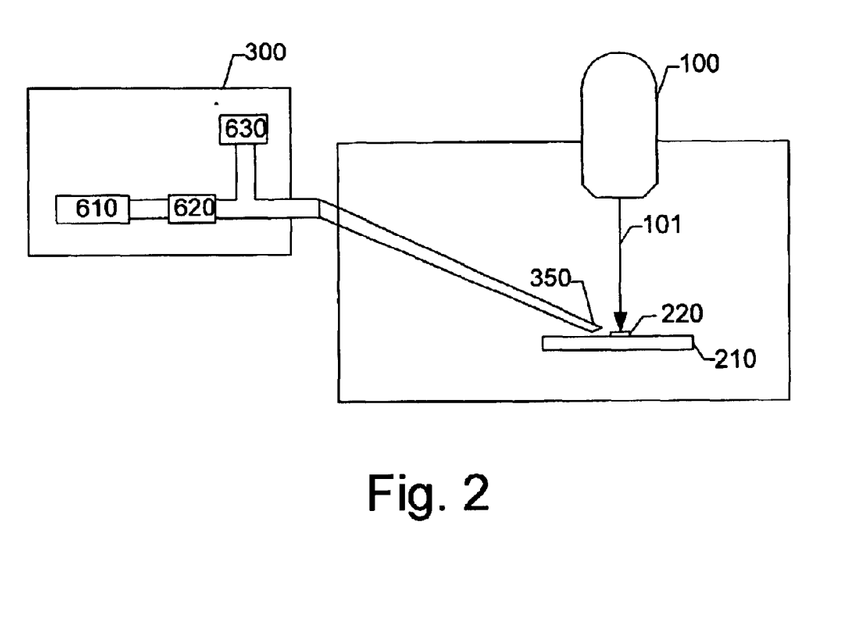
FIG. 2 is a schematic of one embodiment of a gas delivery system for use with the electron beam system of FIG. 1.

A preferred embodiment of the reactant material delivery system 300 is depicted in FIG. 2. This embodiment includes nozzle 350 for delivering an etchant 610, such as xenon difluoride, in selected proximity to the work piece. Etchant flow rates are controlled by a feedback loop between a motorized variable orifice 620 and a pressure transducer 630.

Nozzle 350 is located in selected proximity to the target point where electron beam 101 interacts with the surface of the work piece. Multiple nozzles could also be used to deliver additional etching gases or component of an etching gas. A preferred range for the distance between target point and nozzle tip is 50 to 600 microns in the X-Y plane and 50 to 400 microns in the Z direction. Preferably, the inner diameter of the nozzle 350 is between 100 and 400 microns.

Figure 3:
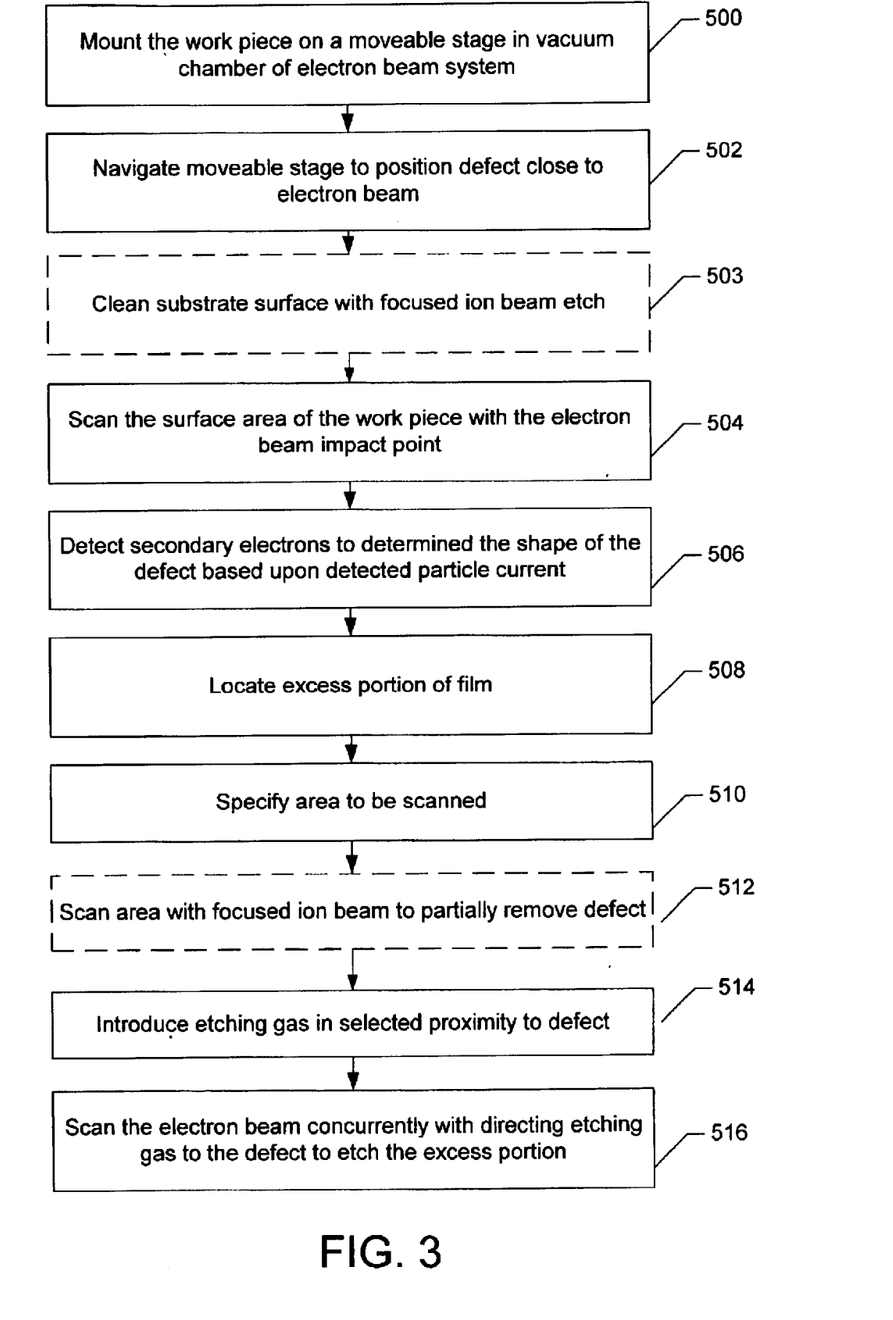
FIG. 3 is a flow chart showing a preferred method of the present invention.

FIG. 3 is a flow chart showing the steps of a preferred embodiment of the present invention. In step 500, work piece 220, typically a photolithography mask, is mounted on movable stage 210 in the vacuum chamber of an electron beam system, such as system 98 of FIG. 1. Any type of electron beam system that is capable of performing the steps described below can be used. It is advantageous to employ a system which features a high brightness field emission gun and digital beam scanning with precise control over the lateral distance and temporal interval between successive placements of the beam, and which is capable of operating at a low electron beam landing energy (~500 V to ~1 keV) and under relatively poor vacuum (~$10^{-5}$ Torr). A suitable electron beam system would be, for example, an electron beam system similar to one configured to function as a scanning electron microscope.

In a preferred embodiment, moveable stage 210 can be moved in the X and Y coordinates so that the desired area of the work piece 220 can be positioned under electron beam 101. Work piece 220 itself typically comprises a substrate composed of a transparent material, such as quartz, having on its surface a patterned metallic film, such as a tungsten film. The vacuum within the vacuum chamber will be approximately $1 \times 10^7$ Torr.

In step 502, moveable stage 210 is navigated to the approximate coordinates of a defect, that is, the defect is approximately aligned with the electron beam at zero deflection. The defect will typically have been previously located by automatic inspection equipment that supplies the coordinates of the defect to controller 480 of electron beam system 98.

In optional step 503, the substrate surface is pre-cleaned by FIB sputtering with or without the presence of an etching gas. This FIB etching serves to clean the surface of the substrate and to remove any oxide layer that would reduce or destroy the effectiveness of the electron beam induced etching in steps 514 and 516. In a preferred embodiment, this optional cleaning step would take place in situ.

In step 504, the surface area of work piece 220 is scanned by the electron beam functioning as a scanning electron microscope. The electrons have a landing energy of between approximately 500 V and approximately 1 keV. In step 506, the secondary electrons emitted by the scanning primary electron beam are detected by secondary electron detector 160 as electron beam 101 scans in step 504. The shape of the defect is then determined based upon detected electron intensities and displayed on monitor 490.

In step 508, the excess material defect is located. In step 510, an operator typically identifies the defect on monitor 490, for example, by drawing a polygon around the defect area. The designated area to be scanned is often referred to as a "box." The defect may also be located and identified automatically. Because the electron beam will not damage the quartz substrate, the entire area within the polygon may be scanned by the electron beam. The scan can also be limited to the actual defect area, as determined by the contrast in image intensity between the defect and non-defect area.

In optional step 512, a focused ion beam, with or without an etch enhancing gas, can be used to remove a portion of the excess material defect, leaving preferably approximately 20–40 nm of material to be removed with the electron beam in step 514 and 516. By removing most of the defect layer using the focused ion beam, the defect is removed more quickly because the etch rate of the ion beam is typically greater than that of the electron beam. The gallium atoms from the focused ion beam typically implant in the target to a depth of between 20–40 nm. By leaving approximately that thickness of material unetched by the ion beam and then using the electron beam to remove the remaining material, little or no gallium will be implanted into the mask itself. If step 512 is used, step 503 is not necessary, and a step of locating the defect area to be scanned is performed before the ion beam is scanned. Separate steps for imaging and drawing a repair box may be needed for the ion beam and electron beam because the beams may not be perfectly aligned.

In step 514, an etching gas is introduced in proximity to and directed toward the excess material defect. A preferred gaseous compound for practicing the invention comprises a compound containing a fluoride or another halogen, for example xenon difluoride. The term halogen or fluorine, as used herein, encompasses any compound that includes a halogen or fluorine atom, respectively, within the skeleton of that compound.

Preferably, the base pressure for the vacuum is on the order of $10^{-6}$ Torr or less. The maximum flow rate from the gas nozzle is preferably limited by the allowable gas pressure rise in the specimen chamber. Thus, the flow rate should be limited to that value which does not raise the base pressure for the vacuum substantially above $10^{-5}$ Torr.

In step 516, concurrently with the introduction of the etching gas in step 514, the electron beam removes the defect by repeatedly scanning the excess portion of the metallic film in the presence of the etching gas. The motion of the electron beam is adjusted to maximize the etching rate. The motion of electron beam can be characterized by a dwell time, the time the beam stays at each point, by the pixel spacing, the distance between successive points, and by a refresh period, the time it takes for the electron beam to return to each dwell point.

The dwell time is adjusted so that the electron beam dwells at each point just long enough for the chemical reaction induced by the electron beam to exhaust the etchant gas adhered to the surface. The refresh period is adjusted to be sufficiently long to allow sufficient etchant gas to adhere to the surface for activation by the electron beam. Skilled persons can determine an approximate dwell time and refresh rate without undue experimentation by varying each until etching is maximized at a particular gas flow.

Electron landing energies of between about 0.5 keV and about 10 keV are preferred, with energies between 1 and 3 keV being most preferred. In general, the efficiency of the removal rate increases with decreasing landing energy until the energy at which a maximum in secondary electron yield is attained. This increase in removal rate must be balanced by a concurrent increase in beam size and consequent loss in lateral resolution when the landing energy is reduced. The preferable beam scanning parameters are dependent upon the spot size and the current density of the electron beam and the flux of the etchant gas over the area of electron irradiation. In general, the amount of electron charge that is required in order to remove a given excess material defect may be minimized by adjusting the pixel spacing to be commensurate with the beam size, by setting the dwell time to match the ratio of the saturated density of the adsorbed etchant gas on the surface to the flux of the electrons, and by fixing the refresh time to be equivalent to the time it takes to adsorb a monolayer of the etchant gas onto the surface.

In one embodiment, a xenon-difluoride gas is used to etch tungsten and the electron beam has a landing energy of approximately 1.5 keV. The refresh period is approximately 4 seconds, the pixel spacing is 4 nm, the electron beam current density is 0.2 A cm$^{-2}$, and the dwell time is about 65 microseconds. The removal rate of polycrystalline tungsten was found to be approximately 0.01 $\mu$m$^3$ per nC. Skilled persons will understand that the optimum electron beam parameters will vary with the material being etched and the etchant gas being used. Skilled persons will be able to determine optimum parameters without undue experimentation by monitoring and maximizing the removal rate, similar to the manner used in focused ion beam systems to maximize etching.

In another embodiment, the invention is used to etch tantalum nitride, TaN, or various molybdenum-silicon compounds, such as silicide compounds like MoSi$_x$O$_y$N$_z$, with X, Y, Z being different for different compounds. This embodiment is particularly useful for repairing or creating photolithography masks used with exposing radiation in the extreme ultraviolet (EUV) range, for example, wavelengths of between about 10 nm and about 15 nm, and preferably about 13 nm. Such wavelengths are also referred to as soft x-ray wavelengths.

Because conventional lens materials absorb light at these short wavelengths, EUV lithography masks are typically "reflective" masks, that is, the pattern on the mask reflects radiation onto the wafer, instead of passing light through the mask onto the work piece. One type of EUV mask is produced by applying multiple alternating layers of molybdenum and silicon onto a flat substrate. The thicknesses of these alternating layers are chosen to "reflect" the approximately 13 nm radiation by constructive interference. The Mo/Si is the reflective portion of the EUV mask. The circuit pattern is produced by applying a final EUV-absorbing metal-containing layer and then etching away the metal-containing layer to form the image of the circuit. Some EUV masks used tantalum nitride, TaN, as the absorbing layer and a thin barrier layer (e.g. a silicon oxide) between the absorbing layer (e.g. TaN) and the reflective layers (e.g. Mo/Si). Thus, repairing an excess material defect or an "opaque" defect requires the same activity for each type of mask, i.e., removing unwanted Cr or unwanted TaN. Gallium focused ion beams are unsuitable for many repairs to such masks. The reflective layers of Mo and Si are extremely thin, typically about 3½ Angstroms, and gallium implanted in the thin layers from a repair of an absorbing layer above would adversely effect the reflective layer's optical properties.

Applicants used an FEI Company Model 83S Dual Beam (ion beam and electron beam) system to etch TaN features using an electron beam and $XeF_2$ gas. The invention is useful for etching some ceramic materials, and TaN is ceramic material that can be etched using the invention. The electron beam was produced by the scanning electron microscope of the dual beam system. The parameters to be adjusted on the system are the same as those described above and include the beam energy, the beam current, the dwell time, the dwell point spacing (that is, the beam overlay from dwell point to dwell point), the refresh rate, and the etchant gas flow rate or pressure.

In one example of electron beam etching of TaN, applicants used an electron beam with a landing energy of 5 keV and a current of 526 pA. The dwell time was 0.2 $\mu$sec and there was little or no overlap between dwell points. A long refresh rate was used to allow sufficient time for the $XeF_2$ to re-coat the surface. Parameters not specified in this example are readily determined by skilled persons using routine skill and the information related with respect to the previous embodiment. Because an EUV mask typically uses a barrier layer of $SiO_2$ below the tantalum layer and the etch rate of the $SiO_2$ using an electron beam and $XeF_2$ is significantly lower than the etch rate for TaN, the invention facilitates stopping the etch process before the reflective MO/Si layers are damaged.

$XeF_2$ will spontaneously etch TaN, that is, $XeF_2$ will etch TaN even in the absence of the electron beam. However the etch rate is greater in the presence of the electron beam and the pattern of material removal is better defined. A relatively low gas pressure that is adequate for the directional, e-beam induced etching but that does not support a fast spontaneous etch is typically used to reduce damage to areas that were not subjected to the electron beam.

The removal of a typical TaN feature representative of a mask defect took between 1½ and 2 minutes. Because the TaN was on a non-conductive silicon oxide material, the work piece tended to acquire an electrical charge during the processing. To compensate for the effect of the charging on the beam position, about four or five times while etching the TaN, applicants re-imaged the TaN feature being etched and adjusted the electron beam scan area by repositioning the repair box over the TaN feature being etched. Other known methods of charge neutralization could also be used.

Figure 4:
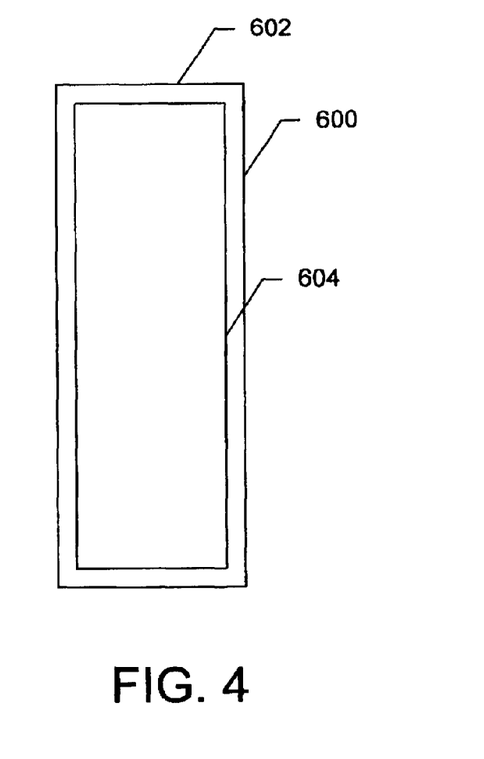
FIG. 4 shows an example of a scan strategy for electron beam processing.

Various milling strategies can be used to ensure complete and efficient removal of the defect. For example, the defect area to be scanned by the electron beam can optionally be defined by two overlapping boxes as shown in FIG. 4. A large box 600 that includes the entire defect 602 and a smaller box 604 that includes most of the defect, but excludes the outer edge. The total electron dose to be applied can be divided between the two boxes, with the edge regions receiving a smaller electron dose. For example, the large box can receive about one third of the total dose and the smaller box can receive about two third of the total dose. The dose can be delivered, for example, by alternately performing two scans of the small box and then a single scan of the large box until the total prescribed dose of electrons was applied. Careful selection of the two box sizes results in a repair that does not have left over material around the perimeter of the defect. Skilled persons can determine appropriate variations and repair strategies for different types of defects and different materials.

It is believed that the gas is adsorbed onto the surface of the exposed layers of the work piece and the electron bombardment provides energy to initiate a reaction of the adsorbed gas molecule with the surface material to be etched. The reaction produces volatile products that dissipate thereby etching or removing material from the surface of the work piece.

The etch rate is thought to vary for different materials because the strength of the etch reaction may vary with different materials, the sticking coefficient of the gas may be different for different materials, and the reaction products may be different and have different degrees of volatility. The gas may inhibit the etching of some materials by producing reaction product that is not volatile and that forms a protective film over the second layer. Although a theoretical basis of the mechanism of the invention is described to provide a more complete understanding, the invention has been shown to work regardless of the accuracy of the proposed mechanism.

In selecting etchant gases, gases that greatly enhance focused ion beam etching of a material are candidates for use with the invention for etching that material. For example, a preferred etchant increases the FIB removal rate by a factor of more than 10 compared to sputtering without the etchant, and a more preferred etchant increases the FIB removal rate by a factor of more than 20.

Applicants have found that gases that are useful for etching in the presence of an electron beam will often spontaneously etch an exposed substrate, even when the electron beam is not present. In order to reduce unwanted etching of the substrate, one typically uses a relatively low pressure of the etchant gas for reasons describe above with respect to $XeF_2$ etching of TaN.

Spontaneous etching can be reduced or eliminated by a protective layer. Many materials form a thin non-reactive layer, referred to as a passivation layer, when the material is exposed to air. The passivation layer can comprise for example, an oxide of the exposed material. In many materials, the passivation layer provides some protection against spontaneous etching by the etchant gas.

As described above with respect to step 503 (FIG. 3), the material to be processed by the electron beam may be cleaned before processing by an ion beam scan to remove the passivation layer. The ion beam and the electron beam do not scan exactly the same area, so to ensure complete cleaning of the area to be processed, it is necessary to scan the ion beam over a larger area. This removes the passivation layer from a larger area, making that area susceptible to spontaneous etching by the etchant gas. Imaging with the FIB of the site around the area to be processed may also remove the passivation layer from a larger area. Moreover, the area newly exposed by the electron beam etching will also be unpassivated and may be susceptible to spontaneous etching. Thus, after an area is processed with the electron beam, there typically remains some unpassivated material that is susceptible to spontaneous etching.

When performing multiple repairs, applicants have found that the etchant gas can spontaneously etch and damage previously repaired sites while additional repairs are being performed. Applicants have also found that damage to the previously repaired site can be prevented if the site is re-passivate after the repair and before re-introducing the etchant gas into the vacuum chamber for the next repair. This process of passivating between repairs is applicable not only to electron beam processes, but to any gas-assisted beam processing, including particle beam or energy beam processing, such as an electron beam, ion beam, or laser beam processing, that is performed in a vacuum chamber and removes a passivation layer. The reactivity of the etchant gas with the substrate materials will determine whether a passivation is required after every repair, or whether multiple repairs can be repaired before passivating. Passivation may be required to protect the material exposed under the etched area, or to protect adjacent area that had their passivation layers removed by the beam during imaging or other processing.

Figure 5:
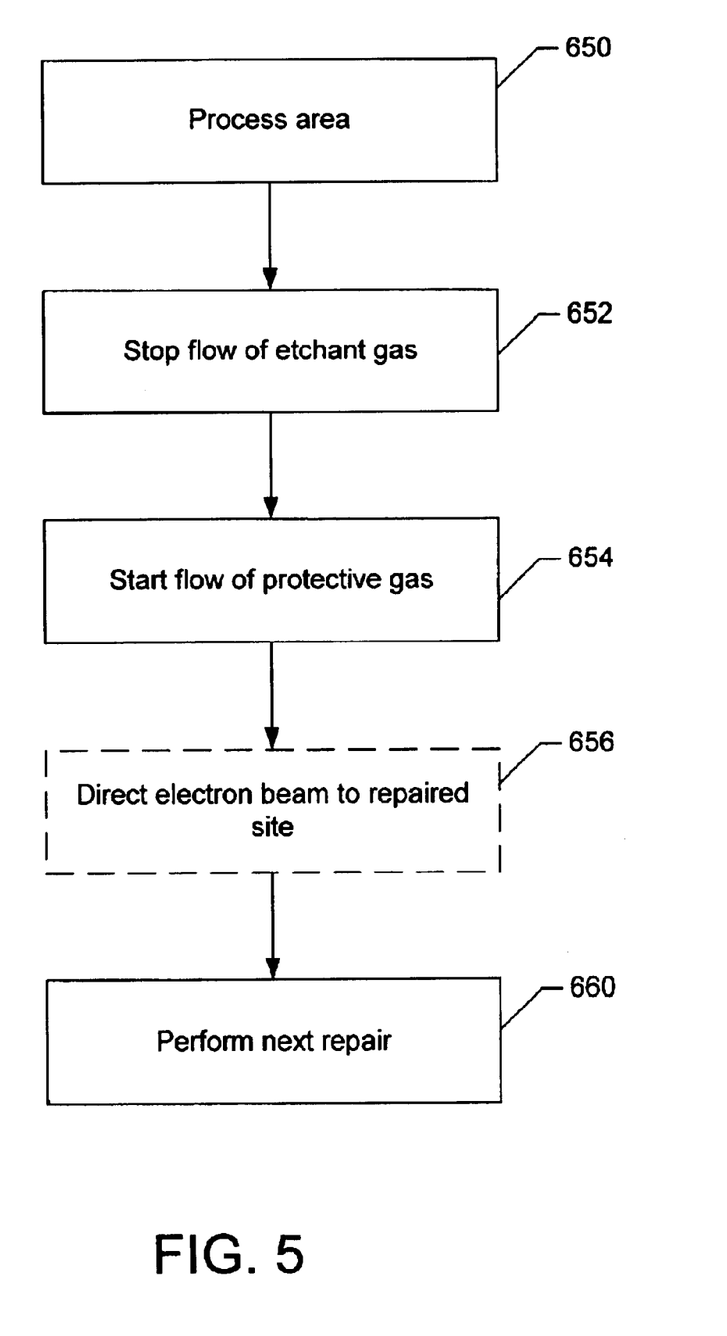
FIG. 5 is a flow chart showing a preferred method of re-passivating a processed site.

FIG. 5 shows an example of the steps that can be used to re-passivate a repaired area. Step 650 shows that a process, such as removing a TaN mask defect using an electron beam and $XeF_2$, is performed. Step 652 shows that the flow of etchant gas is stopped and step 654 shows that a flow of a protective gas is started. The appropriate protective gas used will depend on the substrate. The protective gas will preferably react with the substrate to form a passivation layer. For example, oxygen containing gases, such as water vapor or oxygen or nitrous oxide ($N_2O$), can be used as a protective gas for a TaN that was "unpassivated" by the ion beam. The water vapor or oxygen will form an oxide layer at the TaN surface. The oxidation reaction is self-limiting in many materials and will cease after a thin passivation layer is formed. Water vapor is typically used at a relatively high pressure, such as $1.2 \times 10^5$ mPa. Some protective gases may deposit a protective layer instead of reacting with the substrate to form a protective layer such as hydrocarbon gases like styrene. By passivating the previously processed area, a high gas pressure can be used subsequent processing with less damage to the previously process site.

Step 656, typically performed concurrently with step 654, shows that the electron beam can be scanned over the repaired area while the protective gas is directed at the repaired area. For example, after a repair of TaN, applicants scanned a 560 pA electron beam over the repaired area using the same dwell time, overlaps, and refresh rate that were used with the $XeF_2$ gas when etching TaN as described above. Step 656 may not be required, and directing the protective gas to the previously processed area may be sufficient to form a protective layer, even in the absence of the electron beam. In step 660, the next site is processed.

The invention is also well suited to the repair of defects in phase shift masks. Phase shift photomasks include three-dimensional structures that change the phase of light to produce a sharper image on the wafer being printed when the features being printed approach the wavelength of light used. In one type of phase shift masks, referred to as an alternating phase shift masks, a phase shifting material, such as quartz, is used near alternating edges of opaque absorber material to change the diffraction pattern of light on the wafer being exposed. In another type of phase shift mask, referred to attenuated phase shift masks, partially transmissive material (typically MoSiCN or CrOx) is used on the substrate to change the phase and reduce the transmission of exposing radiation.

Defects in phase shift masks can include excess phase shift material or missing phase shift material. Because the phase shift of the light is relative to the phase of light that passes through the unaltered portion of the mask, a phase shift in light can be created by having the light pass through extra material or by having the light pass through less material. For these reasons, missing phase shift material can be corrected by either depositing additional material so that the light passes through enough additional material to appropriately shift the phase, or by removing material, so that the light passes through less material and is appropriately shifted relative to light passing through the unaltered mask. Similarly, an excess phase shifting material defect can be corrected by removing the excess material or by adding sufficient material so that the light is back in phase with light passing through the unaltered mask.

Because the gallium ions from a gallium focused ion beam can contaminate the phase shift material, the invention is particularly well suited for the repair of phase shift masks. The electron beam can be used with $XeF_2$ to etch phase shift material such as quartz or $MoSi_xC_yN_z$. The electron beam can also be used to deposit phase-shifting material, such as quartz, from a precursor gas such as tetraethylorthosilicate (TEOS) or tetrabutoxysilane or tetramethylcyclotetrasiloxane.

An electron beam system of the present invention can be mounted in the same vacuum chamber as a focused ion beam or can be an independent system. The system can include other accessories, such as other types of surface characterization instruments, including x-ray or Auger electron spectrometers, that can be used to characterize the etch products. Such system can be used to detect when the defect material has been completely removed. In many embodiments, end point detection is not critical because the electron beam will not significantly etch the substrate or will etch the underlying material at significantly slower rate, even in the presence of the etchant gas. The etch process is selective to the opaque material and continuing to direct the electron beam to the substrate in the presence of the gas will not result in overetching or create any flaw in the photolithography mask.

The steps required to repair clear defects on lithography masks by depositing material are similar to those described above with respect to FIG. 3, but instead of using an etchant gas, a gas that decomposes in the presence of the electron beam to deposit a material is used. For example, styrene may be used to deposit carbon, or tungsten carbonyl may be used to deposit tungsten.

Another advantage is that the processing of the materials described above can be performed at room temperature, although heating or cooling of the work piece may be desirable for other materials or under certain conditions.

In another example, the invention is used in the processing of integrated circuits, for example, for editing integrated circuits by etching conductors to break electrical connections or depositing conductors to make electrical connections. Such "circuit editing" allows a chip developer to modify an integrated circuit prototype without having to produce new photolithography masks, thereby reducing both processing costs and development cycle times. In most cases, the feature to be modified is buried under other material, such as insulating layers. Therefore it is typically necessary to mill down through these layers of materials to reach the metal feature of interest without damaging adjacent circuit features. After exposing the feature, a designer typically cuts a conductor to break an electrical connection or deposits a conductor to provide a conductive path to another location in the circuit.

Circuit editing is typically done using a focused ion beam. By using an electron beam and beam-activated etchant gas, the etching process is more selective and will in many cases reduce damage to layers underneath or adjacent to the material that is being etched. The electron beam can be used with $XeF_2$ gas to etch through a dielectric layer to expose a metallic conductor and the metallic conductor can also be etched using $XeF_2$ and the electron beam. Using an electron beam reduce contamination caused by implanting of gallium from the focused ion beam. By using an electron beam and beam-activated gas, such as tungsten hexacarbonyl that decomposes to deposit a conductive tungsten layer or varied platinum containing gases to deposit a conductive platinum layer, there is reduced gallium implanted in the deposited conductive layer. Other gases can be used to deposit gold, carbon, or silicon and oxygen.

Also, avoiding the use of an ion beam avoids sputter damage to the substrate surface areas on which the layer is being deposited. Frequently there is surface damage when depositing a film with a focused ion beam.

The different etch rates of different materials allows the electron beam to selective etch different layers. For example, $SiO_2$ etches relatively slowly compared to metallic or metal-containing compounds, such as Ta, TaN and W, so these materials can be etched and the etch process stopped before an underlying layer of $SiO_2$ is significantly damaged.

Although the electron beam processing invention has been described for use in mask repair and circuit edit, it is not limited to any particular application. For example, the invention can be used for patterning a substrate, such as for making a lithography mask.

The invention has multiple aspects and advantages making it suitable for a wide variety of applications. Not all aspects of the invention need to be present in every embodiment. For example, the invention embodied in FIG. 5 can be used in processes other than mask repair and circuit edit, even processes that do not use electron beam processing.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follow:

1. A method of removing an excess material defect on a photolithography mask, the method comprising:

directing an electron beam activated etchant gas toward the excess material defect on the photolithography mask; and directing an electron beam toward the excess material defect to activate the electron beam activated etchant gas near the impact point of the electron beam to etch the excess material, thereby removing the defect without significantly degrading the properties of the underlying substrate.

2. The method of claim 1 in which directing an electron beam toward the excess material defect includes scanning the electron beam within a non-transmissive area that should be transmissive.

3. The method of claim 1 in which directing an electron beam toward the excess material defect includes scanning the electron beam within an absorbing area that should be non-absorbing.

4. The method of claim 1 in which directing an electron beam toward the excess material defect includes scanning the electron beam within a phase shifting or attenuating area that should be not be phase shifting or attenuating.

5. The method of claim 1 further comprising directing an ion beam toward the excess material defect, the ion beam cleaning the surface of the excess material defect to facilitate etching of the excess material defect by the electron beam.

6. The method of claim 1 in which directing an electron beam activated etchant gas toward the excess material defect includes directing the electron beam activated etchant gas toward an excess material defect comprising tungsten.

7. The method of claim 1 in which directing an electron beam activated etchant gas includes directing a gas comprising a halogen.

8. The method of claim 7 in which directing an electron beam activated etchant gas includes directing a gas comprising fluorine.

9. The method of claim 8 in which directing an electron beam activated etchant gas includes directing a gas comprising xenon difluoride.

10. The method of claim 7 in which directing a gas comprising a halogen includes directing the electron beam activated etchant gas toward an excess material defect comprising tungsten.

11. The method of claim 7 in which directing a gas comprising a halogen includes directing the electron beam activated etchant gas toward an excess material defect comprising tantalum nitride.

12. The method of claim 11 in which directing the electron beam activated etchant gas toward an excess material defect comprising tantalum nitride includes directing the electron beam toward tantalum nitride on an extreme ultraviolet photolithography mask.

13. The method of claim 7 in which directing a gas comprising a halogen includes directing the electron beam activated etchant gas toward an excess material defect comprising molybdenum and silicon.

14. The method of claim 7 in which directing a gas comprising a halogen includes directing the electron beam activated etchant gas toward an excess material defect comprising a phase shifting or attenuating material.

15. The method of claim 1 in which the excess material defect is located at a defect site and further comprising after directing an electron beam toward the excess material defect to etch the excess material, exposing the defect site to a gas to form a protective layer at the defect site.

16. The method of claim 15 in which exposing the defect site to a gas includes exposing the defect sites to water vapor.

17. The method of claim 15 further comprising directing an electron beam toward the defect site while exposing the defect site to a gas to form a protective layer at the defect site.

18. The method of claim 17 in which:
  directing a gas comprising fluorine includes directing the electron beam activated etchant gas toward an excess material defect comprising tantalum nitride;
  directing an electron beam activated etchant gas includes directing a gas comprising xenon difluoride; and
  exposing the defect site to a gas includes exposing the defect sites a water vapor.

19. A method of beam processing multiple sites on a work piece in a vacuum chamber, comprising:
  directing a beam-activated etchant gas toward a site including a material to be etched; and
  directing a beam toward the material to etch the material in the presence of the beam activated gas;
  directing a protective-layer-forming gas toward the site to form a protective layer at the site to protect the site from spontaneous etching by the beam-activated gas during further processing of the work piece.

20. The method of claim 19 in which directing a beam toward the material to etch the material in the presence of the beam activated gas includes directing a charged particle beam toward the material.

21. The method of claim 19 in which directing a beam toward the material to etch the material in the presence of the beam activated gas includes directing an energy beam toward the material.

22. The method of claim 21 in which the energy beam comprises a laser beam.

23. The method of claim 19 in which directing a protective-layer-forming gas toward the site includes directing an oxygen containing gas toward the site.

24. The method of claim 23 in which the oxygen containing gas includes water vapor.

25. The method of claim 23 in which the oxygen containing gas includes oxygen.

26. The method of claim 19 in which directing a protective-layer-forming gas toward the site includes directing a gas that reacts with the material at the site to form a passivation layer.

27. The method of claim 19 in which directing a protective-layer-forming gas toward the site includes directing a gas that decomposes to deposit a protective layer.

28. A method of etching a metallic material, the method comprising:
  directing an electron beam activated etchant gas toward a surface including a metallic material; and
  directing an electron beam toward the metallic material, the electron beam inducing a reaction between the electron beam activated etchant gas and the metallic material, thereby etching the metallic material from the surface at the location to which the electron beam is directed.

29. The method of claim 28 where the metallic material comprises tungsten.

30. The method of claim 28 where the gas contains a halogen.

31. The method of claim 30 where the gas contains fluorine.

32. The method of claim 31 where the gas comprises xenon difluoride.

33. The method of claim 29 where the gas comprises xenon difluoride.

34. A method of etching a compound of including tantalum and nitrogen, the method comprising:
  directing an electron beam activated etchant gas toward a surface including a material including tantalum and nitrogen; and
  directing an electron beam toward the material including tantalum and nitrogen, the electron beam inducing a reaction between the electron beam activated etchant gas and the ceramic material, thereby etching the material from the surface at the location to which the electron beam is directed.

35. The method of claim 34 in which directing an electron beam activated etchant gas toward a surface includes directing xenon difluoride gas toward a surface comprising tantalum and nitrogen.

36. A method of repairing a defect on a photolithography mask, comprising:
  directing an electron beam activated gaseous material toward the defect on the photolithography mask;
  scanning an electron beam over the defect area, the electron beam inducing a reaction between the electron beam activated gas to repair the defect.

37. The method of claim 36 in which directing an electron beam activated gaseous material toward the defect on the photolithography mask comprises directing an electron beam activated gaseous material toward a defect comprising excess material.

38. The method of claim 37 in which the electron beam activated etchant gas comprises fluorine compound.

39. The method of claim 38 in which the etchant gas is xenon difluoride and the excess material comprises tungsten.

40. The method of claim 37 in which the electron beam activated etchant gas comprises fluorine compound.

41. The method of claim 36 in which the defect comprises a lack of material and in which the gas decomposes in the presence of the electron beam to deposit a material.

42. The method of claim 41 in which the gas decomposes in the presence of the electron beam to deposit a material comprising tungsten, platinum, carbon, silicon and oxygen or gold.

43. A method of modifying an integrated circuit, comprising:
  removing insulating material to expose a conductive layer;
  removing a portion of the conductive layer to expose a metallic conductor;
  directing an electron-beam activated gas toward the metallic conductor; and
  directing an electron beam toward the metallic conductor to activate the electron-beam activated gas to etch the conductor or to deposit a material onto the conductor.

44. The method of claim 43 in which removing insulating material to expose a conductive layer includes:
  directing an electron-beam activated etchant toward the insulating material; and
  directing an electron beam toward the insulating material to activate the electron-beam activated etchant and etch the insulating material.

45. The method of claim 43 in which directing an electron-beam activated gas toward the metallic conductor includes directing a precursor gas that decomposes in the presence of the electron beam to deposit tungsten, platinum, carbon, silicon and oxygen, or gold.

46. A system for repairing mask defects, comprising:
  a source of electrons;
  an electron beam optical column for focusing electrons from the electron source onto a lithography mask;
  a source of a mask repair gas;

a gas delivery system for delivering the mask repair gas to the mask in the vicinity of a defective area;

a defect identification means for locating the position of a defective area on the photolithography mask;

a movable stage for supporting the mask and positioning it under the electron beam; and a controller programmed to scan the electron beam within the defective area to cause the mask repair gas to react in the presence of the electron beam to repair the defect.

47. The apparatus of claim 46 in which the gas delivery system includes a source of a gas comprising a halogen.

48. The apparatus of claim 46 in which the gas delivery system includes a source of a gas comprising fluorine.

49. The apparatus of claim 46 in which the gas delivery system includes a source of a gas comprising xenon-difluoride.

* * * * *

UNITED STATES PATENT AND TRADEMARK OFFICE
CERTIFICATE OF CORRECTION

PATENT NO. : 6,753,538 B2  
DATED : June 22, 2004  
INVENTOR(S) : Christian R. Musil et al.

It is certified that error appears in the above-identified patent and that said Letters Patent is hereby corrected as shown below:

<u>Title page,</u>  
Item [75], Inventor, change "Xiadong Da" to -- Xiaodong Da --

Signed and Sealed this

Twenty-eighth Day of June, 2005

JON W. DUDAS  
*Director of the United States Patent and Trademark Office*